(12) United States Patent
Naruse

(10) Patent No.: US 8,669,593 B2
(45) Date of Patent: Mar. 11, 2014

(54) SEMICONDUCTOR INTEGRATED CIRCUIT

(75) Inventor: Tatsuya Naruse, Osaka (JP)

(73) Assignee: Panasonic Corporation, Osaka (JP)

( * ) Notice: Subject to any disclaimer, the term of this patent is extended or adjusted under 35 U.S.C. 154(b) by 320 days.

(21) Appl. No.: 12/963,073

(22) Filed: Dec. 8, 2010

(65) Prior Publication Data

US 2011/0073915 A1   Mar. 31, 2011

Related U.S. Application Data

(63) Continuation of application No. PCT/JP2009/001529, filed on Apr. 1, 2009.

(30) Foreign Application Priority Data

Jun. 10, 2008   (JP) ................................ 2008-151938

(51) Int. Cl.
*H01L 27/118*   (2006.01)

(52) U.S. Cl.
USPC ........................................................ 257/203

(58) Field of Classification Search
USPC ................................................. 257/203, 698
See application file for complete search history.

(56) References Cited

U.S. PATENT DOCUMENTS

| | | | |
|---|---|---|---|
| 7,541,683 B2 | 6/2009 | Sonohara et al. | |
| 7,816,708 B2 | 10/2010 | Maede | |
| 7,829,983 B2 | 11/2010 | Yamada et al. | |
| 8,154,054 B2 | 4/2012 | Maede | |
| 2006/0131726 A1 | 6/2006 | Bruch | |
| 2007/0222082 A1 | 9/2007 | Sonohara et al. | |
| 2007/0267755 A1 | 11/2007 | Vo et al. | |
| 2008/0012046 A1 | 1/2008 | Ojiro | |
| 2008/0157124 A1 | 7/2008 | Taniguchi et al. | |
| 2009/0146273 A1 | 6/2009 | Yamada et al. | |
| 2011/0012245 A1 | 1/2011 | Yamada et al. | |

FOREIGN PATENT DOCUMENTS

| | | |
|---|---|---|
| JP | 05-074945 | 3/1993 |
| JP | 11-330371 | 11/1999 |
| JP | 2002-299567 A | 10/2002 |
| JP | 2004-022777 | 1/2004 |
| JP | 2006-41343 | 2/2006 |
| JP | 2006-179931 A | 7/2006 |
| JP | 2007-258469 A | 10/2007 |
| JP | 2008-021834 | 1/2008 |
| JP | 2008-130644 | 6/2008 |
| WO | 2007-015435 A1 | 2/2007 |
| WO | 2007-136932 A2 | 11/2007 |

OTHER PUBLICATIONS

Japanese Office Action dated May 7, 2013, issued in corresponding Japanese Application No. 2008-151938.

*Primary Examiner* — Bradley K Smith
(74) *Attorney, Agent, or Firm* — McDermott Will & Emery LLP

(57) ABSTRACT

A semiconductor integrated circuit according to the present invention includes an I/O cell, a first PAD connected to the I/O cell, first and second PADs, a package wire which is connected to the first PAD and allows connection between the first PAD and an outside of the semiconductor integrated circuit, and a second package wire which is connected to the second PAD and allows connection between the second PAD and an outside of the semiconductor integrated circuit. A connection point between the first PAD and the fist package wire is located in an area where the I/O cell is placed. A connection point between the second PAD and the second package wire is located outside an area where the I/O cell is placed.

17 Claims, 10 Drawing Sheets

SEMICONDUCTOR INTEGRATED CIRCUIT

CROSS REFERENCE TO RELATED APPLICATION

This is a continuation application of PCT application No. PCT/JP2009/001529 filed on Apr. 1, 2009, designating the United States of America.

BACKGROUND OF THE INVENTION

1. Field of the Invention

The present invention relates to semiconductor integrated circuits, and particularly to a semiconductor integrated circuit including I/O cells and pads.

2. Description of the Related Art

In recent years, semiconductor integrated circuits have been used in a variety of fields and demand for large-scale integration circuits (LSIs) has been growing. Along with such growth, further integration and reduction in size of LSIs are becoming increasingly important for reasons such as reduction of manufacturing costs.

In view of this, internal circuitry of LSIs has been further integrated and reduced in area owing to techniques for miniaturization of transistors. On the other hand, integration of a system on an LSI increases the size of an I/O area in which an external interface circuit of the LSI is placed. In addition, the size of the I/O area is further increased as a trade off for improvement in characteristics of the interface circuit required for higher functionality and higher speed. In this manner, a phenomenon exists that the I/O area increases in size while the internal circuit is further integrated and reduced in area.

FIG. 9 is a plan view showing a configuration of an I/O unit (input-output circuit) included in a conventional semiconductor integrated circuit.

The I/O unit 700 shown in FIG. 9 includes I/O cells 701 and 711, bonding pads (PADs) 702 and 712, via contact holes (VIAs) 704 and 714, package wires 706 and 716, and bonding fingers 707 and 717.

In addition, the conventional I/O unit 700 has an I/O area 750 between an LSI external boundary 752 and an LSI internal circuit boundary 751.

The I/O cells 701 and 711 are placed in the I/O area 750. The I/O cell 701 is an I/O cell for a first signal, and the I/O cell 711 is an I/O cell for a second signal.

The I/O cell 701 includes an internal wiring 705. The I/O cell 711 includes an internal wiring 715.

The PAD 702 is positioned closer to the internal circuit (on the side closer to the LSI internal circuit boundary 751) than the PAD 712 is.

The PAD 702 is connected to the package wire 706 at a connection point 703. The PAD 712 is connected to the package wire 716 at a connection point 713.

The VIA 704 connects the internal wiring 705 and the PAD 702. The VIA 714 connects the internal wiring 715 and the PAD 712.

In the I/O unit 700, although the distance between the LSI internal circuit boundary 751 and the VIA 704 is short, wire resistance and wire inductance for the first signal is high because the package wire 706 is long. On the other hand, although the package wire 716 is short, resistance of the I/O cell internal wiring 715 for the second signal is high because the distance between the LSI internal circuit boundary 751 and the VIA 714 is long.

A technique to solve such a problem has been presented for reducing the resistance of the internal wiring 705 and 715 and the resistance of the package wires 706 and 716.

FIG. 10 is a plan view showing a configuration of an I/O unit 800 with improved characteristics, included in a conventional semiconductor integrated circuit. Components also shown in FIG. 9 are denoted with the same reference numerals, and thus a description thereof is omitted.

In addition to the components of the I/O unit 700, the I/O unit 800 shown in FIG. 10 includes I/O cells 801 and 811, PADs 802 and 812, VIAs 804 and 814, package wires 806 and 816, bonding fingers 807 and 817, and package internal wirings 808 and 818.

The I/O cell 801 is an additional I/O cell for the first signal and the I/O cell 811 is an additional I/O cell for the second signal.

The I/O cell 801 includes an internal wiring 805. The I/O cell 811 includes an internal wiring 815.

The PADs 702 and 812 are positioned closer to the internal circuit than the PADs 712 and 802 are, respectively.

The PAD 802 is connected to the package wire 806 at a connection point 803. The PAD 812 is connected to the package wire 816 at a connection point 813.

The VIA 804 connects the internal wiring 805 and the PAD 802. The VIA 814 connects the internal wiring 815 and the PAD 812.

The package internal wiring 808 connects the bonding finger 707 and the bonding finger 807. The package internal wiring 818 connects the bonding finger 717 and the bonding finger 817.

In the above configuration, the I/O unit 800 has two sets of the I/O cell, the PAD, and the package wire for each of the signals. The two sets are connected in parallel for the corresponding signal. As a result, the resistance of the internal wirings and the package wires is reduced, and therefore characteristics of the I/O unit 800 are improved compared with those of the I/O unit 700.

However, the size of the I/O area 750 of the I/O unit 800 is approximately twice as large as that of the I/O unit 700.

In addition to the above technique, a configuration has been presented as a method of reducing the area of the I/O area 750 in which a plurality of pads is provided inside the I/O cell (for example, see Japanese Unexamined Patent Application Publication Number 11-330371 (Patent Reference 1)).

As described above, the I/O unit 800 according to a conventional technique further includes a set of an I/O cell and a PAD provided to each of the existing I/O cells so that the resistance and inductance of a connection unit (including a package wire, a package internal wiring, a package ball, a bump, or a leadframe), which provides an external connection to the existing PAD, are reduced. Accordingly, the size of the I/O area of the I/O unit 800 is twice as large as the size of the I/O area 750. That is, there is a problem with the conventional I/O unit 800 that characteristics improvement necessitates increase in the chip area.

In addition, the I/O structure presented in Patent Reference 1 has a problem that the plurality of the pads provided in the I/O cell unnecessarily increases the I/O area 750 in size.

The present invention has an object of providing a semiconductor integrated circuit in which a part providing an external connection to an internal circuit has a reduced resistance and increase in the size of an I/O area is reduced.

SUMMARY OF THE INVENTION

In order to achieve the above object, the semiconductor integrated circuit according to an aspect of the present invention includes: an internal circuit; a first I/O cell which is placed in an area surrounding the internal circuit and performs at least one of input and output of a signal to and from the internal circuit; a first pad area and a second pad area included in at least one pad connected to the first I/O cell; a first connection unit connected to the first pad area and configured to allow connection between the first pad area and an outside of the semiconductor integrated circuit; and a second connection unit connected to the second pad area and configured to allow connection between the second pad area and the outside of the semiconductor integrated circuit, wherein a connection point between the first pad area and the first connection unit is located in an area where the first I/O cell is placed, and a connection point between the second pad area and the second connection unit is located in an area outside the first I/O cell.

In this configuration, the first I/O cell is provided with the two connection units. As a result, the connection units (each including a package wire, a package internal wiring, a package ball, a bump, or a leadframe and providing an external connection to the internal circuit) of the semiconductor integrated circuit according to an aspect of the present invention, which provides an external connection to the internal circuit, has a reduced resistance and a reduced inductance.

In addition, since the semiconductor integrated circuit according to the aspect of the present invention has only one I/O cell for one signal, increase in the size of the I/O area is reduced.

In addition, the semiconductor integrated circuit according to the aspect of the present invention has the connection point between the first pad and the second connection unit in the area outside the first I/O cell. This allows a part of an I/O cell adjacent to the first I/O cell or another internal circuit element to be placed in an area below the first pad. Therefore, in the semiconductor integrated circuit according to the aspect of the present invention, increase in the size of the I/O area is reduced.

Furthermore, the semiconductor integrated circuit may include a first pad including the first pad area; and a second pad including the second pad area.

Furthermore, the semiconductor integrated circuit may further include a first wiring connecting the first pad and the second pad.

Furthermore, the semiconductor integrated circuit may further include a first via contact hole connecting the second pad and the first I/O cell.

Furthermore, the semiconductor integrated circuit may include a single pad including the first pad area and the second pad area.

In this configuration, fewer person-hours are required for design processes than in a configuration where a plurality of pads is placed.

Furthermore, the semiconductor integrated circuit may further include: a second I/O cell which is placed adjacent to the first I/O cell in the area surrounding the internal circuit, and performs at least one of input and output of a signal to and from the internal circuit; a third I/O cell which is placed adjacent to the second I/O cell in the area surrounding the internal circuit, and performs at least one of input and output of a signal to and from the internal circuit; a third pad connected to the second I/O cell and the third I/O cell; and a third connection unit connected to the third pad and configured to allow connection between the third pad and an outside of the semiconductor integrated circuit, wherein a connection point between the third pad and the third connection unit is located in one of an area where the second I/O cell is placed and an area where the third I/O cell is placed, and a connection point between the second pad area and the second connection unit is located in the area where the second I/O cell is placed.

In this configuration, the two I/O cells of the second I/O cell and the third I/O cell, one pad of the fourth pad, and the third connection unit are used for one signal. As a result, the I/O cell of the semiconductor integrated circuit according to an aspect of the present invention, which provides an external connection to the internal circuit, has a reduced resistance.

In addition, since only the fourth pad is used for one signal in the semiconductor integrated circuit according to the aspect of the present invention, increase in the size of the I/O area is reduced.

In addition, in the semiconductor integrated circuit according to the aspect of the present invention, the two I/O circuits, that is, (i) the I/O circuit having the first I/O cell and the first and second connection units and (ii) the I/O circuit having the second and third I/O cells and the fourth pad (the third connection unit), are placed adjacent to each other. This allows a part of the first pad to be placed in an area where the fourth pad of the second I/O cell is not placed. This contributes to efficient reduction in the size of the I/O area.

Furthermore, the semiconductor integrated circuit according to an aspect of the present invention may further include a second wiring connecting the second I/O cell and the third I/O cell; and a second via contact hole connecting one of the second I/O cell and the third I/O cell to the third pad.

Furthermore, the semiconductor integrated circuit according to an aspect of the present invention may further include a third via contact hole connecting the other one of the second I/O cell and the third I/O cell to the third pad.

In this configuration, the resistance between the fourth pad and the second I/O cell and the resistance between the fourth pad and the third I/O cell are reduced.

Furthermore, the semiconductor integrated circuit according to an aspect of the present invention include: an internal circuit; a first I/O cell which is placed in an area surrounding the internal circuit, and performs at least one of input and output of a signal to and from the internal circuit; a second I/O cell which is placed adjacent to the first I/O cell in the area surrounding the internal circuit, and performs at least one of input and output of a signal to and from the internal circuit; a pad connected to the first I/O cell and the second I/O cell; and a connection unit connected to the pad and configured to allow connection between the pad and an outside of the semiconductor integrated circuit, wherein a connection point between the pad and the connection unit is located in one of an area where the first I/O cell is placed and an area where the second I/O cell is placed.

In this configuration, the two I/O cells, one pad, and one connection unit is used for one signal. As a result, the I/O cell of the semiconductor integrated circuit according to an aspect of the present invention, which provides an external connection to the internal circuit, has a reduced resistance.

In addition, since only one pad is used for one signal in the semiconductor integrated circuit according to the aspect of the present invention, increase in the size of the I/O area is reduced. For example, the size of the I/O area may be reduced by placing the pad of the I/O cell adjacent to the third I/O cell above the third cell.

Furthermore, at least one of the first I/O cell and the second I/O cell may provide, as the signal, a power input or a grounded input to the internal circuit.

The present invention thus provides a semiconductor integrated circuit in which a part providing an external connection to an internal circuit has a reduced resistance and a reduced inductance and increase in the size of an I/O area is reduced.

FURTHER INFORMATION ABOUT TECHNICAL BACKGROUND TO THIS APPLICATION

The disclosure of Japanese Patent Application No. 2008-151938 filed on Jun. 10, 2008 including specification, drawings and claims is incorporated herein by reference in its entirety.

The disclosure of PCT application No. PCT/JP2009/001529 filed on Apr. 1, 2009, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

A semiconductor integrated circuit according to the present invention is described below in detail with reference to the drawings.

Embodiment 1

A semiconductor integrated circuit according to Embodiment 1 of the present invention has two sets of a PAD and a package wire for each I/O cell. In addition, one of the sets of the PAD and the package wire is placed in an area outside the I/O cell. In this configuration, the resistance and inductance of a part which provides an external connection to an internal circuit of the semiconductor integrated circuit according to Embodiment 1 of the present invention are reduced, and increase in the size of the I/O area is also reduced.

Figure 1:
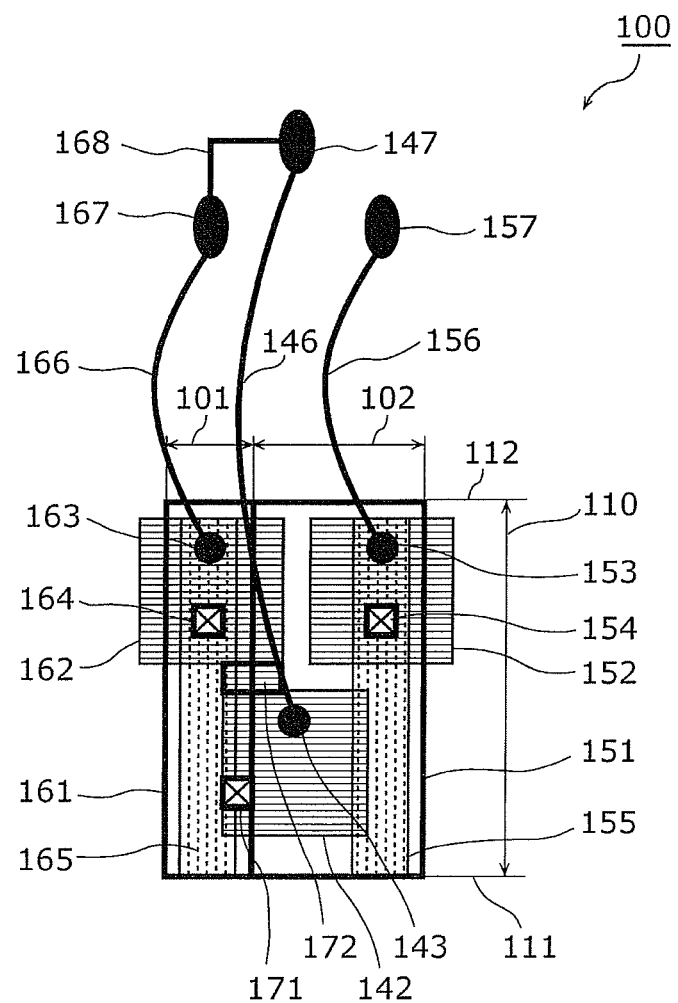
FIG. 1 shows a configuration of an I/O unit of the semiconductor integrated circuit according to Embodiment 1 of the present invention.

FIG. 1 is a plan view showing a configuration of an I/O unit 100 of the semiconductor integrated circuit according to Embodiment 1 of the present invention.

Note that the semiconductor integrated circuit includes what is called a semiconductor chip and a package containing the semiconductor chip.

Figure 2:
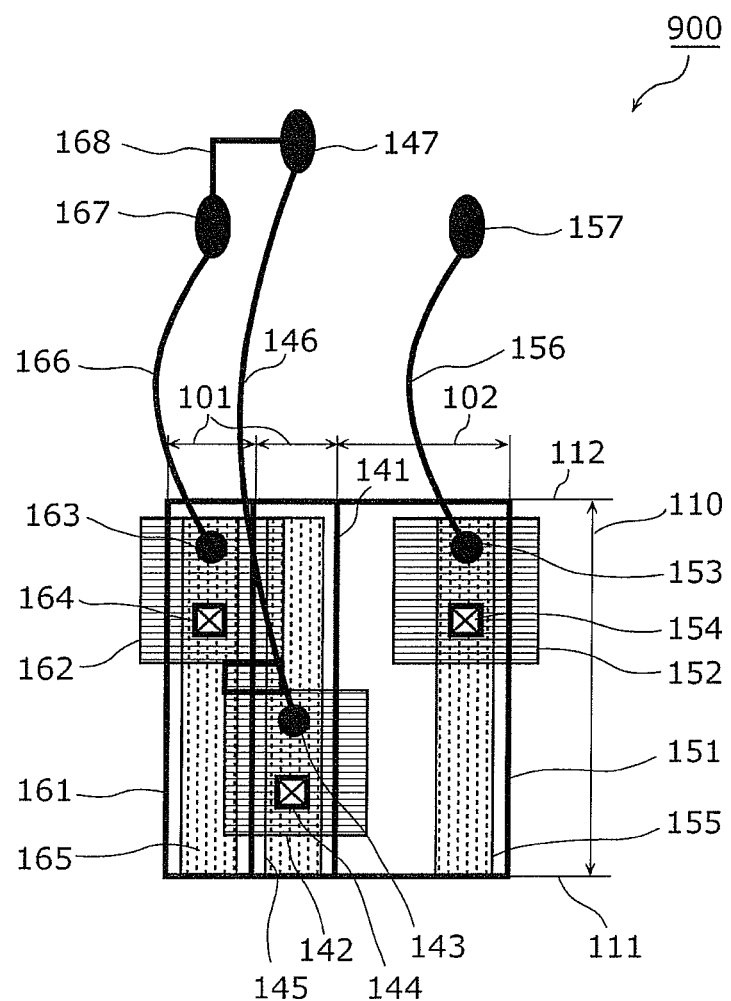
FIG. 2 shows a configuration of an I/O unit included in a semiconductor integrated circuit, which is a comparative example.

FIG. 2 is a plan view showing a configuration of an I/O unit 900, which is a comparative example. This is provided for comparison purposes.

The conventional I/O unit 900 shown in FIG. 2 as a comparative example includes I/O cells 141, 151, and 161, bonding pads (PADs) 142, 152, and 162, via contact holes 144, 154, and 164, package wires (bonging wires) 146, 156, and 166, bonding fingers 147, 157, and 167, and a package internal wiring 168.

The I/O unit 900 performs at least one of input and output of signals between an internal circuit of the semiconductor integrated circuit (semiconductor chip) and the outside of the semiconductor integrated circuit (for example, a printed circuit board on which the semiconductor integrated circuit is mounted).

In addition, the I/O unit 900 has an I/O area 110 between an LSI external boundary 112 and an LSI internal circuit boundary 111. The LSI external boundary 112 is a boundary between the semiconductor chip and the outside thereof. The LSI internal circuit boundary 111 is a boundary between the I/O unit 900 and the internal circuit of the semiconductor chip (a logic circuit inside the semiconductor chip). That is, the I/O area is at least a part of an area surrounding the internal circuit. The I/O cells 141, 151, and 161 each perform at least one of input and output of signals of signals to and from the internal circuit.

The I/O cells 141, 151, and 161 are placed in the I/O area 110. The I/O cells 141 and 161 are I/O cells for a first signal, and the I/O cell 151 is an I/O cell for a second signal. That is, the two I/O cells 141 and 161 are used for the first signal in parallel.

Here, the I/O cells 141, 151, and 161 each have a circuit layout which includes at least one of a circuit for signal input (input buffer), a circuit for signal output (output buffer), a circuit for signal input and output (input-output buffer), and an electrostatic-destruction protection circuit.

The lateral width 102 of the I/O cell 151 is approximately twice as large as the lateral width 101 of each of the normal I/O cells 141 and 161. Here, the "lateral" indicates a direction perpendicular to the direction from the internal circuit to the outside of the semiconductor chip. This expression is used herein below. The direction from the internal circuit to the outside of the semiconductor chip is indicated using "vertical".

The I/O cell 141 includes an internal wiring 145. The I/O cell 161 includes an internal wiring 165. The I/O cell 151 includes an internal wiring 155. The internal wiring 145, 155, and 165 are connected to the internal circuit of the semiconductor integrated circuit. The internal wiring 145, 155, and 165 may be connected to the internal circuit via the circuit for signal input, the circuit for signal output, or the circuit for signal input and output included in the I/O cells 141, 151, and 161, respectively.

The PAD 142 is positioned closer to the internal circuit (on the side closer to the LSI internal circuit boundary 111) than the PAD 152 and the PAD 162 are. The PAD 152 and the PAD 162 are arranged laterally adjacent to each other.

The width of each of the PADs 142, 152, and 162 is equivalent to twice the width 101 of the I/O cell. For example, the width of each of the PADs 142, 152, and 162 is larger than the width of the I/O cell 101 and smaller than twice the width 101.

That is, the PADs of the I/O unit 900 are arranged in a staggered pattern of two vertically adjacent arrays.

The PAD 142 is connected to the package wire 146 at a connection point 143. The PAD 152 is connected to the package wire 156 at a connection point 153. The PAD 162 is connected to the package wire 166 at a connection point 163. Here, the connection points 143, 153, and 163 are central points of portions which connect the PADs 142, 152, and 162 to the package wires 146, 156, and 166, respectively.

The VIA 144 connects the internal wiring 145 and the PAD 142. The VIA 154 connects the internal wiring 155 and the PAD 152. The VIA 164 connects the internal wiring 165 and the PAD 162.

The bonding fingers 147, 157, and 167 are formed on a substrate of the package. The bonding fingers 147, 157, and 167 are connected to the package wires 146, 156, and 166, respectively.

The package internal wiring 168 is formed in the substrate of the package and connects the bonding finger 147 and the bonding finger 167.

In the I/O unit 900 in the above configuration, the total width across the I/O cells 141, 151, and 161 for the first and second signals is four times the width 101 of one of the I/O cells.

The I/O unit 100 shown in FIG. 1 according to Embodiment 1 of the present invention is described below.

The I/O unit 100 shown in FIG. 1 does not include the I/O cell 141 or the VIA 144, which are included in the I/O unit 900 shown in FIG. 2, and include a VIA 171 and a wiring 172 instead of them. That is, the I/O unit 100 has a set of one I/O cell and two PADS, that is, the I/O cell 161 and the PADs 142 and 162, for the first signal.

Components also shown in FIG. 2 are denoted with the same reference numerals, and thus a description thereof is omitted.

The VIA 171 connects the internal wiring 165 and the PAD 142.

The wiring 172 connects the PAD 142 and the PAD 162.

In addition, the connection point 163 is located in an area where the I/O cell 161 is placed, and the connection point 143 is located in an area outside the I/O cell 161 (that is, in an area where the I/O cell 151 is placed). That is, the lateral center of the PAD 162 is located in the area where the I/O cell 161 is placed, and the lateral center of the PAD 142 is located in the area outside the I/O cell 161 (that is, in the area where the I/O cell 151 is placed).

In the I/O unit 100 in the above configuration, the connection point 143 is provided in the area outside the I/O cell 161. This allows a part of the I/O cell 151 to be placed in an area below the PAD 142.

Specifically, the width of the I/O unit 100 is three times as large as the width 101 of the normal I/O cell 161. In this manner, in the I/O unit 100 according to Embodiment 1 of the present invention, increase in the size of the I/O area 100 is reduced compared to increase in the size of the I/O area in the conventional I/O unit 900.

In addition, compared to the case where one PAD and one package wire are used for the first signal, in the I/O unit 100, using two PADs and two package wires, that is, the PADs 142 and 162 and the package wires 146 and 166, for the first signal reduces the resistance and inductance of the connection units providing external connections to the PADs 142 and 162. That is, in the I/O unit 100, the part providing an external connection to the internal circuit has a reduced resistance and a reduced inductance.

Note that the I/O unit 100 may include only one of the VIA 171 and the wiring 172.

In addition, the I/O unit 100 may include a plurality of sets of the PAD 142, the VIA 171, the wiring 172, the package wire 146, the bonding finger 147, and the package internal wiring 168.

In addition, the I/O unit 100 according to Embodiment 1 is applicable to the case where the width 102 of the I/O cell 151 is larger than twice the width 101 of the normal I/O cell 161.

In addition, the chip area may be reduced by placing another internal circuit element in the area from which the I/O cell 141 has been removed.

In addition, the I/O cell 161 may be configured as an I/O cell including at least one of the VIA 171 and the wiring 172.

In addition, the internal wiring 165 and the PAD 142 may be connected not only via the VIA 171 but also via one or more of the VIAs 171 and one or more lines. For example, the I/O unit 100 may further include a line connected to the internal wiring 165, and the VIA 171 may connect the line and the PAD 142. Alternatively, the I/O unit 100 may further include a line connected to the PAD 142, and the VIA 171 may connect the line and the internal wiring 165.

Similarly, the wiring 172 may include one or more lines and VIAs

Embodiment 2

A semiconductor integrated circuit according to Embodiment 2 of the present invention has one PAD and two package wires for one I/O cell. In this configuration, the resistance and inductance of the part which provides an external connection to an internal circuit of the semiconductor integrated circuit according to Embodiment 2 of the present invention are reduced, and increase in the size of the I/O area is also reduced.

Figure 3:
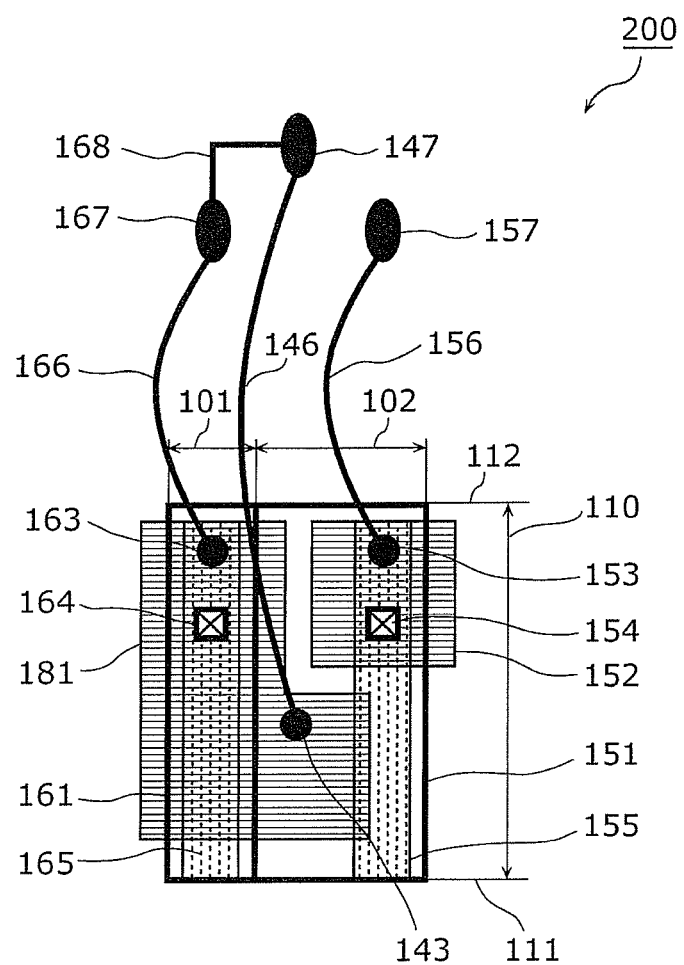
FIG. 3 shows a configuration of an I/O unit of a semiconductor integrated circuit according to Embodiment 2 of the present invention.

FIG. 3 is a plan view showing a configuration of an I/O unit 200 of the semiconductor integrated circuit according to Embodiment 2 of the present invention. Components also shown in FIG. 1 are denoted with the same reference numerals, and thus a description thereof is omitted.

The I/O unit 200 shown in FIG. 3 is different from the I/O unit 100 shown in FIG. 1 in that the I/O unit 200 includes a PAD 181 instead of the PADs 162 and 142 and does not have the VIA 171 or the wiring 172.

The PAD 181 is connected to the package wire 166 at the connection point 163 and to the package wire 146 at the connection point 143.

The VIA 164 connects the internal wiring 165 and the PAD 181.

Note that although the PAD 181 and the wiring 172 described in Embodiment 1 are formed in, for example, metal layers in the same level, the PAD 181 is different from the wiring 172 in that an opening (a portion where a passivation film is not formed) for allowing connection of the PAD 181 (and the PADs 142 and 162) to the package wires 146 and 166 is provided on the PAD 181 (and the PADs 142 and 162), whereas a passivation film is formed on the wiring 172.

In the above configuration, the I/O unit 200 according to Embodiment 2 of the present invention has not only the effect of the I/O unit 100 according to Embodiment 1 but also an effect that the I/O unit 200 can be designed in fewer person-hours, because person-hours for placing the wiring 172 and the VIA 171 are no longer necessary.

Note that the present embodiment is applicable also to the case where the width 102 of the I/O cell 151 is larger than twice the width 101 of the normal I/O cell 161.

In addition, the chip area may be reduced by placing another internal circuit element in the area from which the I/O cell 141 has been removed.

Embodiment 3

A semiconductor integrated circuit according to Embodiment 3 of the present invention has one set of a PAD and a package wire for two I/O cells. In this configuration, the resistance and inductance of the part which provides external connections to an internal circuit of the semiconductor integrated circuit according to Embodiment 3 of the present invention are reduced, and increase in the size of the I/O area is also reduced.

Figure 4:
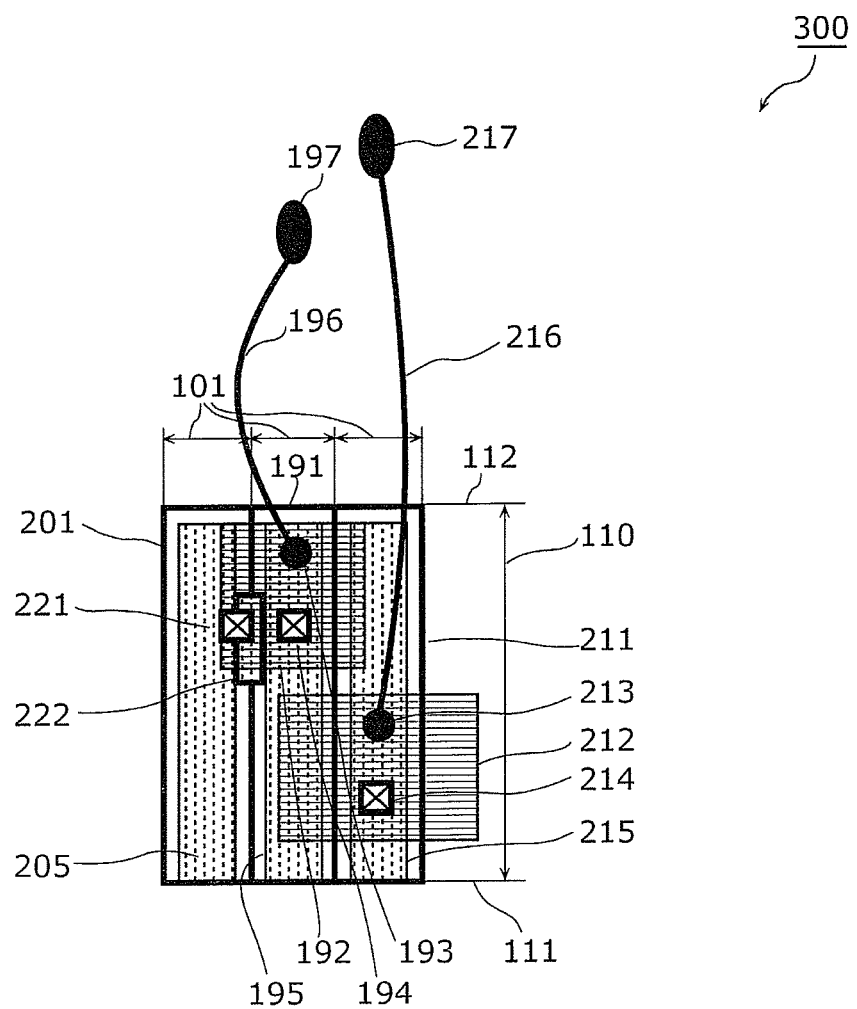
FIG. 4 shows a configuration of an I/O unit of a semiconductor integrated circuit according to Embodiment 3 of the present invention.

FIG. 4 is a plan view showing a configuration of an I/O unit 300 of the semiconductor integrated circuit according to Embodiment 3 of the present invention.

Figure 5:
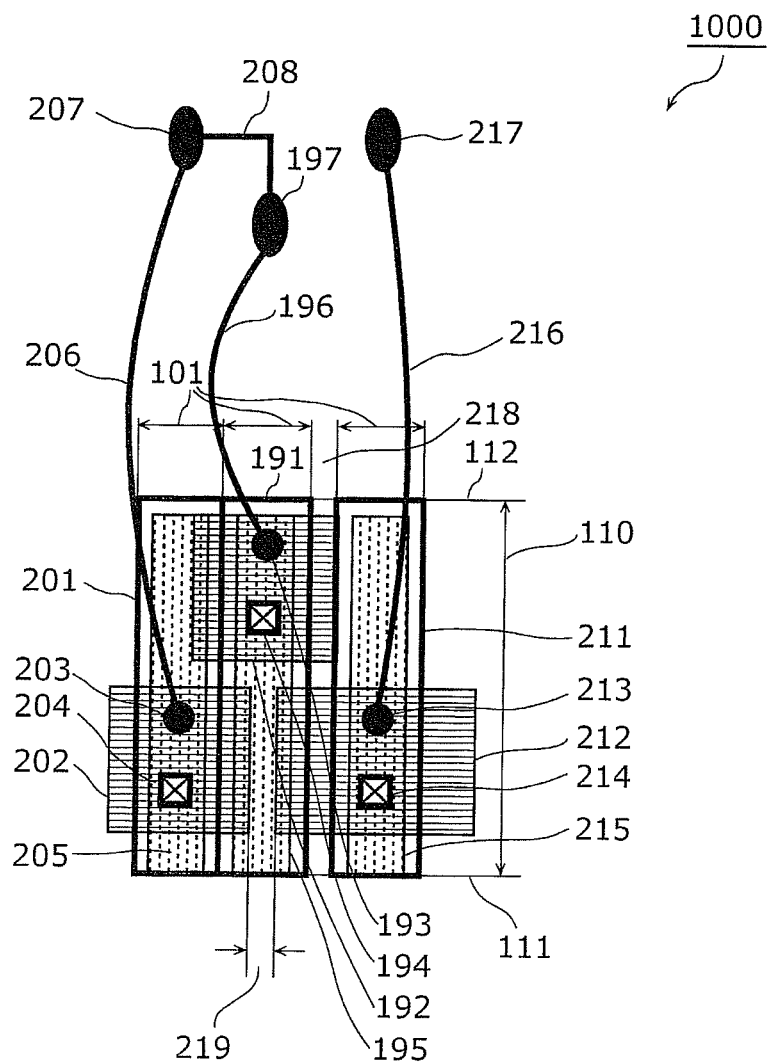
FIG. 5 shows a configuration of an I/O unit included in a semiconductor integrated circuit, which is a comparative example.

FIG. 5 is a plan view showing a configuration of an I/O unit 1000, which is a comparative example. This is provided for comparison purposes.

The I/O unit 1000 shown in FIG. 5 includes I/O cells 191, 201, and 211, PADs 192, 202, and 212, VIAs 194, 204, and 214, package wires 196, 206, and 216, bonding fingers 197, 207, and 217, and a package internal wiring 208.

The I/O cells 191, 201, and 211 are placed in the I/O area 110. The I/O cells 191 and 201 are I/O cells for a third signal, and the I/O cell 211 is an I/O cell for a fourth signal. That is, the two I/O cells 191 and 201 are used in parallel for the third signal.

The I/O cell 191 includes an internal wiring 195. The I/O cell 201 includes an internal wiring 205. The I/O cell 211 includes an internal wiring 215. The internal wiring 195, 205, and 215 connect to an internal circuit of the semiconductor integrated circuit.

The PAD 212 is larger than each of the normal PADs 192 and 202 in lateral width.

The PADs 202 and 212 are positioned closer to the internal circuit than the PAD 192 is. The PADs 202 and 212 are arranged laterally adjacent to each other. That is, the PADs of the I/O unit 1000 are arranged in a staggered pattern of two vertically adjacent arrays.

The PAD 192 is connected to the package wire 196 at a connection point 193. The PAD 202 is connected to the package wire 206 at a connection point 203. The PAD 212 is connected to the package wire 216 at a connection point 213.

The VIA 194 connects the internal wiring 195 and the PAD 192. The VIA 204 connects the internal wiring 205 and the PAD 202. The VIA 214 connects the internal wiring 215 and the PAD 212.

The bonding fingers 197, 207, and 217 are connected to the package wires 191, 206, and 216, respectively.

The package internal wiring 208 connects the bonding finger 197 and the bonding finger 207.

The I/O unit 1000 in the above configuration has a clearance having a lateral width 218 in the I/O area 110 due to a constraint on a minimum clearance between the PAD 202 and the PAD 212. Therefore, the total width across the three I/O cells 191, 201, and 210 is approximately 3.5 times as large as the width 101 of the one normal I/O cell 191 (201).

The I/O unit 300 according to Embodiment 3 of the present invention is described below.

The I/O unit 300 shown in FIG. 4 does not include the PAD 202, the VIA 204, the package wire 206, the bonding finger 207 or the package internal wiring 208, which are included in the I/O unit 1000 shown in FIG. 5, and includes a VIA 221 and a wiring 222 instead of them. That is, the I/O unit 300 has the two I/O cells 191 and 201 and the one PAD 192 for the third signal.

Components also shown in FIG. 5 are denoted with the same reference numerals, and thus a description thereof is omitted.

The VIA 221 connects the internal wiring 205 and the PAD 192.

The wiring 222 connects the internal wiring 195 and the internal wiring 205.

In the I/O unit 300 in the above configuration, since part of the PAD 212 of the I/O cell 211 is placed above the I/O cell 191, the size of the I/O area 110 is reduced.

Specifically, the lateral width of the I/O unit 300 is three times as large as the width 101 of the normal I/O cell 191. In this manner, in the I/O unit 300 according to Embodiment 3 of the present invention, increase in the size of the I/O area 110 is reduced compared to increase in the size of the I/O area in the conventional I/O unit 1000.

In addition, compared to the case where one I/O cell is used for the third signal, in the I/O unit 300, using the two I/O cells 191 and 201 for the third signal, that is, using the internal wiring 195 and internal wiring 205 in parallel for the third signal, reduces the resistance between the internal circuit and the PAD 192. That is, in the I/O unit 300, the part providing external connections to the internal circuit has a reduced resistance.

Note that the I/O unit 300 may include only one of the VIA 221 and the wiring 222.

In addition, the I/O unit 300 may include a plurality of sets of the I/O cell 201, the VIA 221, and the wiring 222.

In addition, the chip area may be reduced by placing another internal circuit element in the area from which the I/O cell 110 has been removed.

In addition, the I/O cell 191 or 201 may be configured as an I/O cell including at least one of the VIA 221 and the wiring 222.

In addition, the internal wiring 205 and the PAD 192 may be connected not only via the VIA 221 but also via one or more of the VIAs 221 and one or more lines.

Similarly, the wiring 222 may include one or more lines and VIAs.

In addition, the center of the PAD 192 and the connection point 193, which are present on the I/O cell 191 in FIG. 4, may be present on the I/O cell 201.

Embodiment 4

A semiconductor integrated circuit according to Embodiment 4 of the present invention includes an I/O unit 400 in which a part of the I/O unit 100 according to Embodiment 1 and a part of the I/O unit 300 according to Embodiment 3 are arranged adjacently. The part of the I/O unit 100 is the part to be used for the first signal, including the I/O cell 161. The part of the I/O unit 300 is the part to be used for the third signal, including the I/O cells 191 and 201.

Figure 6:
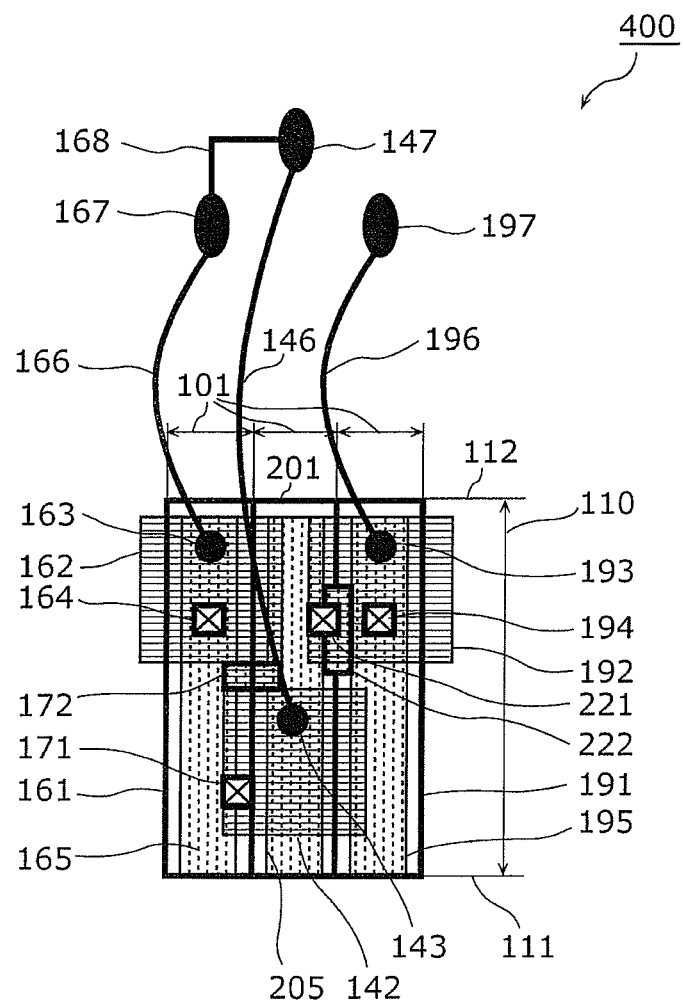
FIG. 6 shows a configuration of the I/O unit included in the semiconductor integrated circuit according to Embodiment 4 of the present invention.

FIG. 6 is a plan view showing a configuration of the I/O unit 400 included in the semiconductor integrated circuit according to Embodiment 4 of the present invention. Components also shown in FIG. 1 or FIG. 4 are denoted with the same reference numerals, and thus a description thereof is omitted.

As shown in FIG. 6, the connection point 143 is located in the area of the I/O cell 201. In other words, the lateral center of the PAD 142 is located in the area of the I/O cell 201.

In the I/O unit 400 in the above configuration, a part of the PAD 142 is allowed to be placed in an area where the PAD 192 of the I/O cell 191 is not placed. This contributes to efficient reduction in the size of the I/O area 110.

Figure 10:
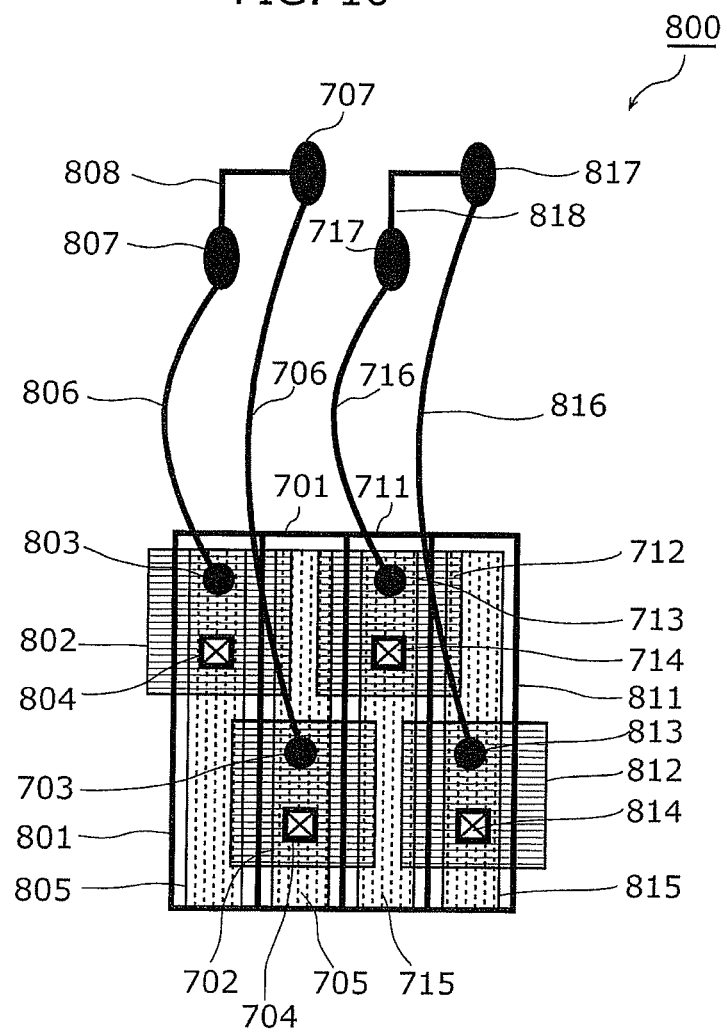
FIG. 10 shows a configuration of an I/O unit included in a conventional semiconductor integrated circuit.

For example, the width of the I/O area of the conventional I/O unit 800 shown in FIG. 10 needs to be four times as large as the width 101 of the normal I/O cell. In comparison, the I/O area 110 of I/O unit 400 according to Embodiment 4 has a width reduced to three times of the width 101 of the normal I/O cell.

In addition, compared to the case where one PAD and one package wire are used for the first signal, in the I/O unit 400, using the two PADs 162 and 142 and the two package wires 166 and 146 for the first signal reduces the resistance and inductance of the part providing an external connection to the internal circuit.

In addition, compared to the case where one I/O cell is used for the third signal, in the I/O unit 400, using the two I/O cells 191 and 201 for the third signal, that is, using the internal wiring 195 and 205 in parallel for the third signal, reduces the resistance and inductance of the part providing an external connection to the internal circuit.

Note that the I/O unit 400 may include only one of the VIA 171 and the wiring 172.

Note that the I/O unit 400 may include only one of the VIA 221 and the wiring 222.

In addition, the I/O unit 400 may include a plurality of sets of the PAD 142, the VIA 171, the wiring 172, the package wire 146, the bonding finger 147, and the package internal wiring 168.

In addition, the I/O unit 400 may include a plurality of sets of the I/O cell 201, the VIA 221, and the wiring 222.

In addition, the I/O cell 161 may be configured as an I/O cell including at least one of the VIA 171 and the wiring 172.

In addition, the I/O cell 191 or 201 may be configured as an I/O cell including at least one of the VIA 221 and the wiring 222.

In addition, the internal wiring 165 and the PAD 142 may be connected not only via the VIA 171 but also via one or more of the VIAs 171 and one or more lines.

Similarly, the wiring 172 may include one or more lines and VIAs.

In addition, the internal wiring 205 and the PAD 192 may be connected not only via the VIA 221 but also via one or more of the VIAs 221 and one or more lines.

Similarly, the wiring 222 may include one or more lines and VIAs.

In addition, the part to be used for the first signal described in Embodiment 2 may be used as the part to be used for the first signal in Embodiment 4. That is, the I/O unit 400 may include the PAD 181 instead of the PADs 162 and the 142, and may not include the VIA 171 or the wiring 172.

Embodiment 5

In above-described Embodiment 4, the PADs are arranged in two vertically adjacent arrays. Embodiment 5 according to of the present invention will describe a semiconductor integrated circuit in which PADs are arranged in one laterally extending array.

Figure 7:
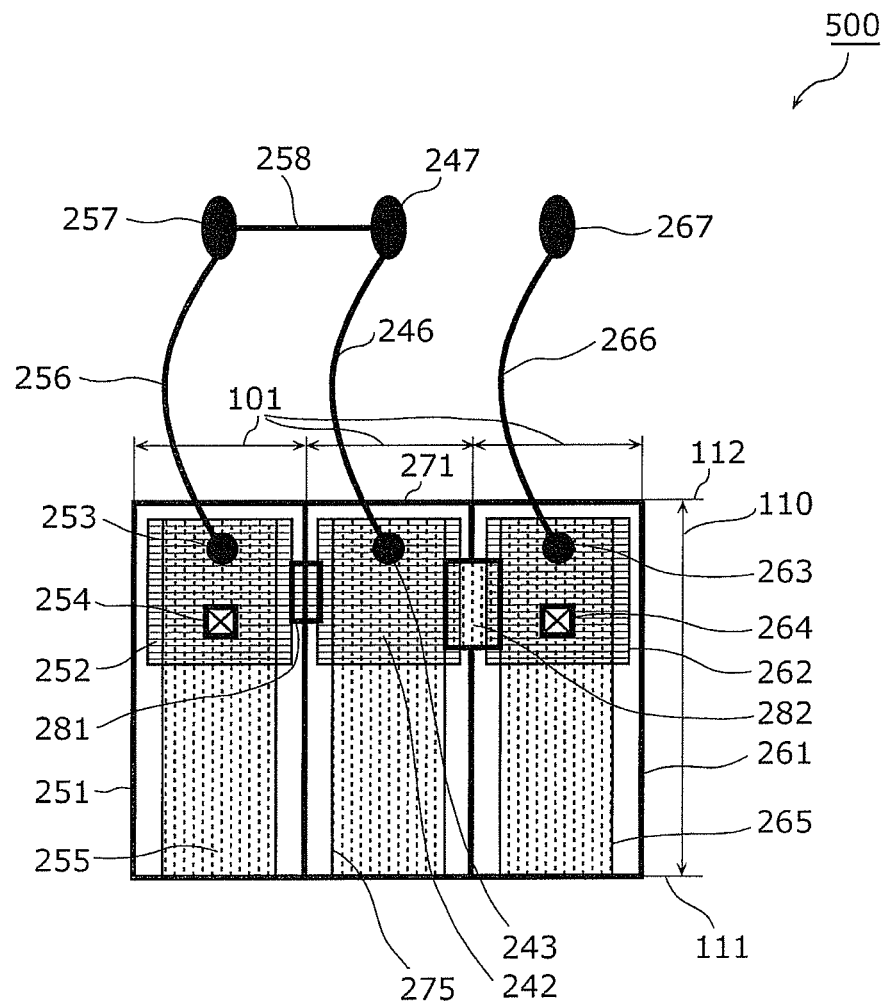
FIG. 7 shows a configuration of the I/O unit included in the semiconductor integrated circuit according to Embodiment 5 of the present invention.

FIG. 7 is a plan view showing a configuration of the I/O unit 500 included in the semiconductor integrated circuit according to Embodiment 5 of the present invention.

The I/O unit 500 shown in FIG. 7 includes I/O cells 251, 261, and 271, PADs 242, 252, 262, VIAs 254 and 264, package wires 246, 256, and 266, bonding fingers 247, 257, and 267, a package internal wiring 258, and wirings 281 and 282.

The I/O cells 251, 261, and 271 are placed in the I/O area 110.

For the first signal, the I/O cell 251, the PADs 242 and 252, the VIA 254, the package wires 246 and 256, the bonding fingers 247 and 257, the package internal wiring 258, and the wiring 281 are used.

For the third signal, the I/O cells 261 and 271, the PAD 262, the VIA 264, the package wire 266, the bonding finger 267, and the wiring 282 are used.

That is, one I/O cell and two PADs are used for the first signal, and two I/O cells and one PAD are used for the third signal.

The I/O cell 251 includes an internal wiring 755. The I/O cell 261 includes an internal wiring 265. The I/O cell 271 includes an internal wiring 275. The internal wiring 255, 265, and 275 are connected to an internal circuit of the semiconductor integrated circuit.

The PADs 242, 252 and 262 are arranged laterally in one row. The lateral width of each of the PADs 242, 252, and 262 is equivalent to the lateral width 101 of the I/O cell. Specifically, the width of each of the PADs 242, 252, and 262 is smaller than the width 101 of the I/O cell. The PADs 242, 252, and 262 are formed in the areas where the I/O cells 271, 251, and 261 are formed, respectively.

The PAD 242 is connected to the package wire 246 at a connection point 243. The PAD 252 is connected to the package wire 256 at a connection point 253. The PAD 262 is connected to the package wire 266 at a connection point 263.

The connection point 243 is located in an area outside the I/O cell 251 (that is, in an area where the I/O cell 271 is placed). The connection point 253 is located in an area where the I/O cell 251 is placed. The connection point 263 is located in an area where the I/O cell 261 is placed. That is, the lateral center of the PAD 242 is located in the area outside the I/O cell 251 (that is, in an area where the I/O cell 271 is placed). The lateral center of the PAD 252 is located in an area where the I/O cell 251 is placed. The lateral center of the PAD 262 is located in an area where the I/O cell 261 is placed.

The VIA 254 connects the internal wiring 255 and the PAD 252. The VIA 264 connects the internal wiring 265 and the PAD 262.

The bonding fingers 247, 257, and 267 are connected to the package wires 246, 256, and 266, respectively.

The package internal wiring 258 connects the bonding finger 247 and the bonding finger 257.

The wiring 281 connects the PAD 242 and the PAD 252.

The wiring 282 connects the internal wiring 265 and the internal wiring 275.

In the I/O unit 500 in the above configuration, the PAD 242 is allowed to be placed in an area where the I/O cell 271 is placed. This contributes to efficient reduction in the size of the I/O area 110.

For example, the I/O area 110 of I/O unit 500 has a width reduced to three times the width 101 of the normal I/O cell.

In addition, compared to the case where one PAD and one package wire are used for the first signal, in the I/O unit 500, using the two PADs 242 and 252 and the two package wires 246 and 256 for the first signal reduces the resistance and inductance of the part providing an external connection to the internal circuit.

In addition, compared to the case where one I/O cell is used for the third signal, in the I/O unit 500, using the two I/O cells 261 and 271 for the third signal, that is, using the internal wiring 265 and the internal wiring 275 for the third signal in parallel, reduces the resistance and inductance of the part providing an external connection to the internal circuit.

Note that the I/O unit 500 may include a plurality of sets of the PAD 242, the wiring 281, the package wire 246, the bonding finger 247, and the package internal wiring 258.

In addition, the I/O unit 500 may include a plurality of sets of the I/O cell 271 and the wiring 282.

In addition, the I/O cell 251 may be configured as an I/O cell including the wiring 281.

In addition, the I/O cell 261 or 271 may be configured as an I/O cell including the wiring 282.

In addition, the wiring 281 may include one or more lines and VIAs.

In addition, the wiring 282 may include one or more lines and VIAs.

In addition, the PADs 242 and 252 may not be connected by the wiring 281 but formed as one PAD.

Embodiment 6

In above-described Embodiment 4, the PADs are arranged in two vertically adjacent arrays. Embodiment 6 of the present invention describes a semiconductor integrated circuit in which PADs are arranged in three vertically adjacent arrays FIG. 8 is a plan view showing a configuration of the I/O unit 600 included in the semiconductor integrated circuit according to Embodiment 6 of the present invention.

Figure 8:
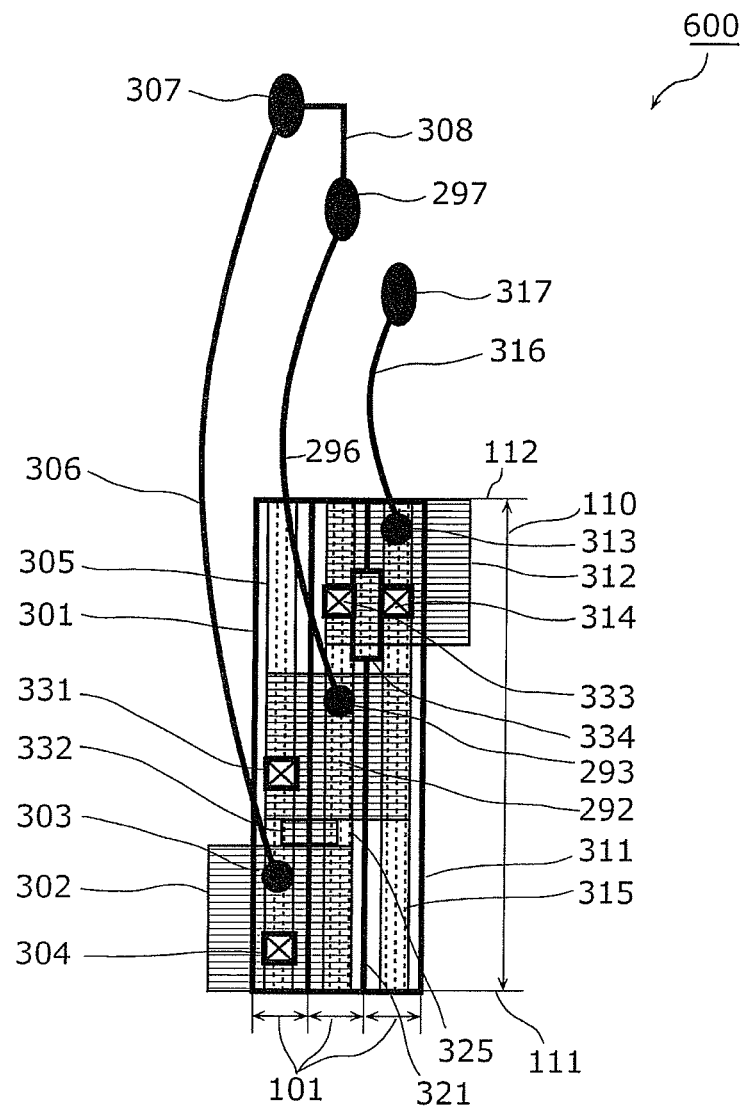
FIG. 8 shows a configuration of the I/O unit included in the semiconductor integrated circuit according to Embodiment 6 of the present invention.
Figure 9:
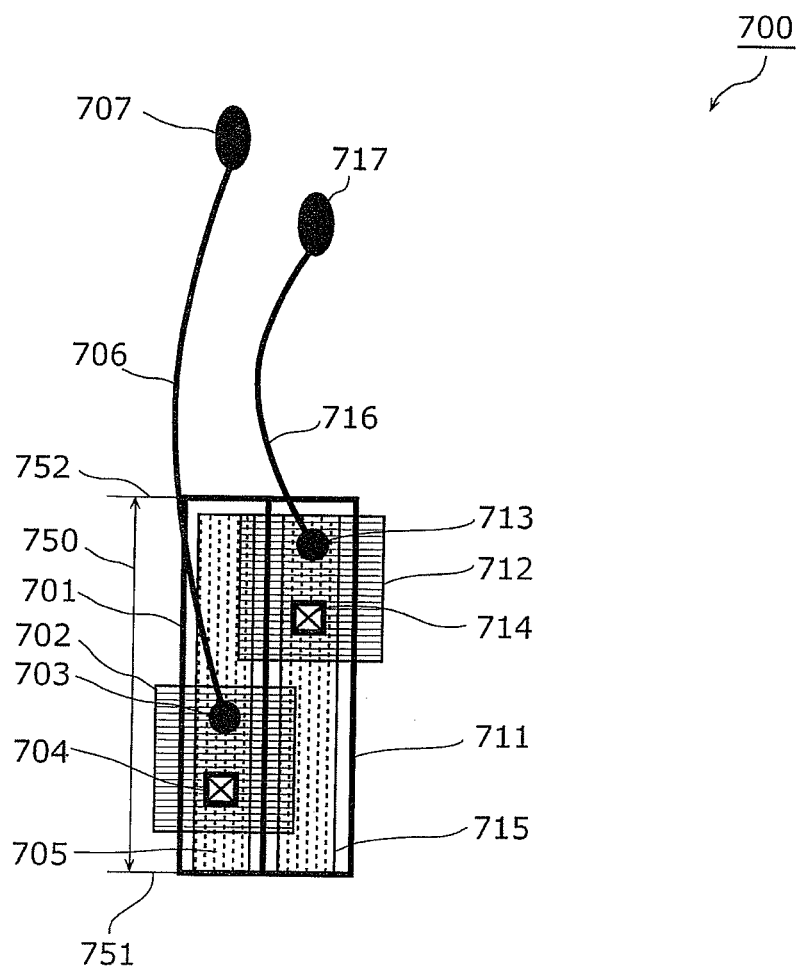
FIG. 9 shows a configuration of an I/O unit included in a conventional semiconductor integrated circuit.

The I/O unit 600 shown in FIG. 8 includes I/O cells 301, 311, and 321, PADs 292, 302, and 312, VIAs 304, 314, 331, and 333, package wires 296, 306, and 316, bonding fingers 297, 307, and 317, a package internal wiring 308, and wirings 332 and 334.

The I/O cells 301, 311, and 321 are placed in the I/O area 110.

For the first signal, the I/O cell 301, the PADs 292 and 302, the VIAs 304 and 331, the package wires 296 and 306, the bonding fingers 297 and 307, the package internal wiring 308, and the wiring 332 are used.

For the third signal, the I/O cells 311 and 321, the PAD 312, the VIAs 314 and 333, the package wire 316, the bonding finger 317, and the wiring 334 are used.

That is, one I/O cell and two PADs are used for the first signal, and two I/O cells and one PAD are used for the third signal.

The I/O cell 301 includes an internal wiring 305. The I/O cell 311 includes an internal wiring 315. The I/O cell 321 includes an internal wiring 325. The internal wirings 305, 315, and 325 are connected to an internal circuit of the semiconductor integrated circuit.

The PAD 302 is positioned closer to the internal circuit than the PAD 292 is, and the PAD 292 is positioned closer to the internal circuit than the PAD 312 is. The lateral width of each of the PADs 292, 302, and 312 is equivalent to three times the lateral width 101 of the I/O cell. Specifically, the width of each of the PADs 292, 302, and 312 is larger than twice the width 101 of the I/O cell and smaller than three times the width 101. That is, the PADs of the I/O unit 600 are arranged in a staggered pattern of three vertically adjacent arrays.

The PAD 292 is connected to the package wire 296 at a connection point 263. The PAD 302 is connected to the package wire 306 at a connection point 303. The PAD 312 is connected to the package wire 316 at a connection point 313.

The connection point 293 is located in an area outside the I/O cell 301 (that is, in an area where the I/O cell 321 is placed). The connection point 303 is located in an area where the I/O cell 301 is placed. The connection point 313 is located in an area where the I/O cell 311 is placed. That is, the lateral center of the PAD 292 is located in the area outside the I/O cell 301 (that is, in an area where the I/O cell 321 is placed). The lateral center of the PAD 302 is located in an area where the I/O cell 301 is placed. The lateral center of the PAD 312 is located in an area where the I/O cell 311 is placed.

The VIA 304 connects the internal wiring 305 and the PAD 302. The VIA 314 connects the internal wiring 315 and the PAD 312. The VIA 331 connects the PAD 292 and the internal wiring 305. The VIA 333 connects the PAD 312 and the internal wiring 325.

The bonding fingers 297, 307, and 317 are connected to the package wires 296, 306, and 316, respectively.

The package internal wiring 308 connects the bonding finger 297 and the bonding finger 307.

The wiring 332 connects the PAD 292 and the PAD 302. The wiring 334 connects the internal wiring 315 and the internal wiring 325.

In the above configuration, in the I/O unit 600 according to Embodiment 6 of the present invention, a part of the PAD 292 is allowed to be placed in an area of the I/O cell 321 where the PAD 312 is not placed. This contributes to efficient reduction in the size of the I/O area 110.

For example, the I/O area 110 of the I/O unit 600 has a width reduced to three times the width 101 of the normal I/O cell.

In addition, compared to the case where one PAD and one package wire are used for the first signal, in the I/O unit 600, using the two PADs 292 and 302 and the two package wires 296 and 306 for the first signal reduces the resistance and inductance of the part providing an external connection to the internal circuit.

In addition, compared to the case where one I/O cell is used for the third signal, in the I/O unit 600, using the two I/O cells 311 and 321 for the third signal, that is, using the internal wiring 315 and 325 for the third signal in parallel, reduces the resistance and inductance of the part providing an external connection to the internal circuit.

Note that the I/O unit 600 may include only one of the VIA 331 and the wiring 332.

In addition, the I/O unit 600 may include only one of the VIA 333 and the wiring 334.

In addition, the I/O unit 600 may include a plurality of sets of the PAD 292, the VIA 331, the wiring 332, the package wire 296, the bonding finger 297, and the package internal wiring 308.

In addition, the I/O unit 600 may include a plurality of sets of the I/O cell 321, the VIA 333, and the wiring 334.

In addition, the I/O cell 301 may be configured as an I/O cell including at least one of the VIA 331 and the wiring 332.

In addition, the I/O cell 311 or 321 may be configured as an I/O cell including at least one of the VIA 333 and the wiring 334. In addition, the internal wiring 305 and the PAD 293 may be connected not only via the VIA 331 but also via one or more of the VIAs 331 and one or more lines.

Similarly, the wiring 332 may include one or more lines and VIAs.

In addition, the internal wiring 325 and the PAD 313 may be connected not only via the VIA 333 but also via one or more of the VIAs 333 and one or more lines.

Similarly, the wiring 332 may include one or more lines and VIAs.

In addition, the PADs 293 and 302 may not be connected by the wiring 332 but formed as one PAD.

Although the semiconductor integrated circuits according to the embodiments of the present invention have been described, the present invention is not limited these embodiments.

For example, in above Embodiments 1 to 6, at lease one of the first signal, the second signal, the third signal, and the fourth signal may be a power source or a ground (GND).

In addition, although one PAD and one internal wiring are connected using one VIA in above Embodiments 1 to 6, they may be connected using a plurality of VIAs.

In addition, although in above Embodiments 1 to 6, the connection unit which is connected to an PAD and provides a connection to the outside of the semiconductor integrated circuit includes a package wire and a package internal wiring, the connection unit needs to include only at least one or more of a package wire, a package internal wiring, a package ball, a bump, and a leadframe. In other words, the present invention is applicable to semiconductor integrated circuits of a variety of package types, such as pin insertion packaging (dual inline package (DIP), single inline package (SIP), zigzag inline package (ZIP), pin grid array (PGA), and the like) and surface mount packaging (small-outline package (SOP), ball grid array (BGA), land grid array (LGA), chip scale packaging (CSP) and the like).

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to semiconductor integrated circuits, and particularly to semiconductor integrated circuits provided with I/O cells and PADs.

What is claimed is:

1. A semiconductor integrated circuit, comprising:
an internal circuit;
a first I/O cell which is placed in an area surrounding said internal circuit and performs at least one of input and output of a signal to and from said internal circuit;
a second I/O cell which is placed adjacent to said first I/O cell, in a first direction, in the area surrounding said internal circuit, and performs at least one of input and output of a signal to and from said internal circuit;
a first pad and a second pad which are connected to said first I/O cell;
a first connection unit connected to said first pad and configured to allow connection between said first pad and an outside of said semiconductor integrated circuit; and
a second connection unit connected to said second pad and configured to allow connection between said second pad and the outside of said semiconductor integrated circuit, wherein:
a first connection point between said first pad and said first connection unit is located in an area where said first I/O cell is placed, and
a second connection point between said second pad and said second connection unit is located in an area where said second I/O cell is placed.

2. The semiconductor integrated circuit according to claim 1,
wherein said first pad and said second pad fail to overlap in a second direction which is perpendicular to the first direction.

3. The semiconductor integrated circuit according to claim 2, further comprising a first wiring connecting said first pad and said second pad.

4. The semiconductor integrated circuit according to claim 2, further comprising a first via contact hole connecting said second pad and said first I/O cell.

5. The semiconductor integrated circuit according to claim 2, wherein said first pad and said second pad are formed as a single pad.

6. The semiconductor integrated circuit according to claim 2,
wherein at least one of said first I/O cell and said second I/O cell provides, as the signal, a power input or a grounded input to said internal circuit.

7. A semiconductor integrated circuit, comprising:
an internal circuit;
a first I/O cell which is placed in an area surrounding said internal circuit and performs at least one of input and output of a signal to and from said internal circuit;
a second I/O cell which is placed adjacent to said first I/O cell in the area surrounding said internal circuit, and performs at least one of input and output of a signal to and from said internal circuit;
a first pad and a second pad which are connected to said first I/O cell;
a first connection unit connected to said first pad and configured to allow connection between said first pad and an outside of said semiconductor integrated circuit;
a second connection unit connected to said second pad and configured to allow connection between said second pad and the outside of said semiconductor integrated circuit;
a third I/O cell which is placed adjacent to said second I/O cell in the area surrounding said internal circuit, and performs at least one of input and output of a signal to and from said internal circuit;
a third pad connected to said second I/O cell and said third I/O cell; and
a third connection unit connected to said third pad and configured to allow connection between said third pad and an outside of said semiconductor integrated circuit, wherein:
a first connection point between said first pad and said first connection unit is located in an area where said first I/O cell is placed,
a second connection point between said second pad and said second connection unit is located in an area where said second I/O cell is placed, and
a third connection point between said third pad and said third connection unit is located in one of an area where said second I/O cell is placed and an area where said third I/O cell is placed.

8. The semiconductor integrated circuit according to claim 7, further comprising:
a second wiring connecting said second I/O cell and said third I/O cell; and
a second via contact hole connecting one of said second I/O cell and said third I/O cell to said third pad.

9. The semiconductor integrated circuit according to claim 8, further comprising:
a third via contact hole connecting the other one of said second I/O cell and said third I/O cell to said third pad.

10. A semiconductor integrated circuit, comprising:
an internal circuit;
a first I/O cell which is placed in an area surrounding the internal circuit and performs at least one of input and output of a signal to and from the internal circuit;
a second I/O cell which is placed adjacent to the first I/O cell in the area surrounding the internal circuit, and performs at least one of input and output of a signal to and from the internal circuit;
a first pad and a second pad which are connected to the first I/O cell;

a first connection unit connected to the first pad and configured to allow connection between the first pad and an outside of the semiconductor integrated circuit; and a second connection unit connected to the second pad and configured to allow connection between the second pad and the outside of the semiconductor integrated circuit, wherein:

the first pad and the first connection unit is connected at a first connection point located in an area where the first I/O cell is placed, the second pad and the second connection unit is connected at a second connection point located in an area where the second I/O cell is placed, and the first pad and the second pad have a same electrical potential.

11. The semiconductor integrated circuit according to claim 10, further comprising a first wiring connecting the first pad and the second pad.

12. The semiconductor integrated circuit according to claim 10, further comprising a first via contact hole connecting the second pad and the first I/O cell.

13. The semiconductor integrated circuit according to claim 10, wherein the first pad and the second pad are formed as a single pad.

14. The semiconductor integrated circuit according to claim 10, further comprising:

a third I/O cell which is placed adjacent to the second I/O cell in the area surrounding the internal circuit, and performs at least one of input and output of a signal to and from the internal circuit;

a third pad connected to the second I/O cell and the third I/O cell; and a third connection unit connected to the third pad and configured to allow connection between the third pad and an outside of the semiconductor integrated circuit, wherein a third connection point between the third pad and the third connection unit is located in one of an area where the second I/O cell is placed and an area where the third I/O cell is placed.

15. The semiconductor integrated circuit according to claim 14, further comprising:

a second wiring connecting the second I/O cell and the third I/O cell; and a second via contact hole connecting one of the second I/O cell and the third I/O cell to the third pad.

16. The semiconductor integrated circuit according to claim 15, further comprising:

a third via contact hole connecting the other one of the second I/O cell and the third I/O cell to the third pad.

17. The semiconductor integrated circuit according to claim 10, wherein at least one of the first I/O cell and the second I/O cell provides, as the signal, a power input or a grounded input to the internal circuit.

* * * * *